(12) United States Patent
Yoneda

(10) Patent No.: US 8,160,193 B2
(45) Date of Patent: Apr. 17, 2012

(54) SPREAD SPECTRUM CLOCK GENERATOR

(75) Inventor: Satoshi Yoneda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 937 days.

(21) Appl. No.: 12/213,781

(22) Filed: Jun. 24, 2008

(65) Prior Publication Data

US 2009/0102526 A1   Apr. 23, 2009

Related U.S. Application Data

(62) Division of application No. 11/175,342, filed on Jul. 7, 2005, now Pat. No. 7,620,094.

(30) Foreign Application Priority Data

Jul. 9, 2004  (JP) ................................. 2004-203320

(51) Int. Cl.
*H04L 7/00* (2006.01)
(52) U.S. Cl. ........ 375/354; 375/316; 327/141; 358/409; 358/410; 358/411; 358/412; 370/503; 714/12
(58) Field of Classification Search .................. 375/354, 375/316; 327/141; 358/409, 410, 411, 412; 370/503; 714/12
See application file for complete search history.

(56) References Cited

U.S. PATENT DOCUMENTS

| | | | |
|---|---|---|---|
| 5,488,627 A | 1/1996 | Hardin et al. | |
| 5,872,807 A | 2/1999 | Booth | |
| 6,404,834 B1 | 6/2002 | Hardin | |
| 6,570,944 B2 * | 5/2003 | Best et al. | 375/355 |
| 2004/0136440 A1 | 7/2004 | Miyata et al. | |
| 2005/0285641 A1 | 12/2005 | Miyata et al. | |
| 2006/0244499 A1 | 11/2006 | Miyata et al. | |

FOREIGN PATENT DOCUMENTS

| | | |
|---|---|---|
| JP | 7-235862 | 9/1995 |
| JP | 2004-207846 | 7/2004 |
| JP | 2004-208037 | 7/2004 |

OTHER PUBLICATIONS

Japanese Office Action dated Jan. 7, 2009 with Partial English Translation.

* cited by examiner

*Primary Examiner* — David Payne
*Assistant Examiner* — Zewdu Kassa
(74) *Attorney, Agent, or Firm* — McGinn Intellectual Property Law Group, PLLC

(57) ABSTRACT

A delay-type phase adjusting circuit including a first variable delay circuit for receiving a reference clock signal and adding a delay to the reference clock signal, for output a phase comparator for receiving an output of the first variable delay circuit and the reference clock signal and detecting a phase difference therebetween a control circuit for generating a control signal for variably controlling a delay value of the first variable delay circuit based on a result of phase comparison by said phase comparator a second variable delay circuit for receiving an input signal and adding a delay to the input signal, for output a computation circuit for receiving a predetermined value and the control signal and variably controlling a delay value of the second variable delay circuit.

8 Claims, 15 Drawing Sheets

FIG. 4A

COMMON CONDITIONS: PERIOD 5000 ps, MODULATION DEGREE ±0.8%, MINIMUM OSCILLATION PERIOD T1/INTERVAL PERIOD D1 = 300 FIXED

| STATE | MINIMUM OSCILLATION PERIOD T0 | CONTROL PERIOD INTERVAL D0 | FREQUENCY CONTROL SIGNAL C | MAXIMUM VALUE A OF MODULATION CONTROL SIGNAL | MODULATION PERIOD |
|---|---|---|---|---|---|
| A | 3000 ps | 10 ps | 200 | (300+200) × 0.8% = 4 | 4 × 10ps = 40ps |
| B | 1500 ps | 5 ps | 700 | (300+700) × 0.8% = 8 | 8 × 5ps = 40ps |

*STATE B IS A CASE WHERE DELAY VALUE THEREOF HAS BECOME A HALF OF THAT IN STATE A DUE TO INFLUENCE OF MANUFACTURING VARIATIONS AND ENVIRONMENTAL VARIATIONS.
MODULATION DEGREE BECOMES ±40 ps/5000 ps = ±0.8%, WHICH IS THE SAME AS SET VALUE.

FIG. 4B

CONDITIONS: PERIOD 7500 ps, MODULATION DEGREE ±0.8%, MINIMUM OSCILLATION PERIOD T1/INTERVAL PERIOD D1 = 300 FIXED

| STATE | MINIMUM OSCILLATION PERIOD T0 | CONTROL PERIOD INTERVAL D0 | FREQUENCY CONTROL SIGNAL C | MAXIMUM VALUE A OF MODULATION CONTROL SIGNAL | MODULATION PERIOD |
|---|---|---|---|---|---|
| C | 3000 ps | 10 ps | 450 | (300+450) × 0.8% = 6 | 6 × 10ps = 60ps |

STATE C IS A CASE WHERE CLOCK PERIOD IS CHANGED TO 7500 ps UNDER CONDITIONS OF STATE A. MODULATION DEGREE BECOMES ±60 ps/7500 ps = ±0.8%, WHICH IS THE SAME AS SET VALUE.

SPREAD SPECTRUM CLOCK GENERATOR

CROSS REFERENCE TO RELATED APPLICATIONS

The present Application is a Divisional Application of U.S. patent application Ser. No. 11/175,342, filed on Jul. 7, 2005 now U.S. Pat. No. 7,620,094.

FIELD OF THE INVENTION

The present invention relates to a clock frequency spreading (Spread Spectrum Clock Generation: also referred to as "SSCG") device, for reducing EMI (Electromagnetic Interference) of a semiconductor integrated circuit.

BACKGROUND OF THE INVENTION

With increased operation speed and improved functions of semiconductor integrated circuits, so-called EMI countermeasure for controlling radiated noise to be within a regulated value have especially become difficult. Thus, it sometimes happens that even if EMI countermeasure components, such as an EMI filter or a decoupling capacitor, are mounted on a printed circuit board, the regulated value cannot be cleared.

Further, the mounting of the EMI countermeasure components on a printed circuit board may result in an increase in the occupied area thereof and the cost. In a situation where a lot of the semiconductor integrated circuits are synchronized with a clock signal, an SSCG technique for modulating a clock frequency to reduce a peak spectrum thereof is drawing attention.

FIG. 9 is a diagram showing a configuration described in Patent Document 1.

Reference numeral Y1 31 denotes a piezoelectric crystal used in an oscillation circuit 32, and generates a stable clock pulse train or an unmodulated clock signal. A first programmable counter 35 divides (frequency divides) the unmodulated clock signal by an integer number (M). A clock signal output from a voltage controlled oscillator 39 (VCO) for adjusting an oscillation frequency based on a voltage from a filter 38 is supplied to a buffer 40. From the buffer 40, an output clock is output. The frequency of the clock signal is proportional to an input voltage from a phase comparator 37 and the filter 38. The clock signal output from the VCO 39 is supplied to a second programmable counter 42, where the clock signal from the VCO 39 is frequency divided by an integer number (N), for supply to the phase comparator 37.

The phase comparator 37 and the filter 38 generate an analog signal that is proportional to the phase in error between the first programmable counter 35 and the second programmable counter 42, respectively. The clock signal from the buffer is thus equal to the oscillator frequency times (N/M). Spread spectrum modulation is performed using spread spectrum modulation means 41 that changes the M and the N as a function of time. A third programmable counter 45 divides the output of an oscillating circuit 32 by an integer number (1) that sets the rate that the M and the N change or modulation frequency.

First and second look-up tables 46 and 47 are, respectively, the stabilized values of the M and the N that modulate the frequency of the output clock signal.

An up/down counter 49 is used to index successive entries in the look-up tables. A serial link 51 may be used to program different values in the programmable counters or look-up tables to modify modulation characteristics.

FIG. 10 is a diagram showing other configuration described in Patent Document 1. The spread spectrum modulation is performed by a second VCO 52 and an analog modulated signal, which is the output of a digital to analog converter 83 (DAC).

In case of no modulation, the second VCO 52 creates a clock signal identical to the first VCO 39. The second VCO 51 responds to the analog modulation to thereby create the spread spectrum clock output signal.

The modulation is performed through the use of a ROM 82 that stores modulation amplitude values that are fed into the digital to analog converter 83. The count output of an up/down counter 84 is used as an address in the ROM 82. A third programmable counter 85 sets the modulation frequency.

[Patent Document 1]

JP Patent Kokai Publication No. JP-A-7-235862 (FIGS. 6 and 9)

SUMMARY OF THE DISCLOSURE

In conventional configurations described above, there is a problem that a desired degree of modulation cannot be obtained due to the following reasons:

manufacturing variations in the semiconductor integrated circuit; and a use environment such as a supply voltage, ambient temperature, and a frequency used.

When the degree of modulation is small, the effect of reducing the EMI will be reduced. On the contrary, when the degree of modulation is great, the maximum frequency of the clock will be increased, so that the circuit which supplies the clock may malfunction.

In the semiconductor integrated circuit, due to the manufacturing variations, the supply voltage, and the temperature used, the characteristics of transistors, resistors, and capacitors that constitutes the semiconductor integrated circuit will vary. For this reason, the characteristics of the filter and the VCO will vary.

The configuration in FIG. 9 generates a modulated clock by changing the values of the M and the N. In other words, by causing the frequency of the VCO to respond to different frequencies, the modulated clock signal is generated. FIG. 11 shows an example of frequency transition when design is performed so that frequency response characteristics constituted from characteristics of the filter and the VCO and the change time of the M and the N are optimized.

As described before, when the characteristics of the filter and the VCO have varied and then a frequency response speed is slow, a target frequency is switched before the frequency of the modulated clock becomes the target frequency, as shown in FIG. 12. The degree of frequency modulation is thus reduced. The larger the degree of the modulation, the larger the effect of reducing the EMI tends to be. Thus, in the case of FIG. 12, the degree of the modulation becomes smaller than is expected, so that the effect of reducing the EMI is reduced.

On the contrary, when the frequency response speed is fast, there are generated states in which the frequency of the modulated clock exceeds the target frequency and states in which the frequency of the modulated clock is stabilized at the target frequency. When a clock that exceeds the operating frequency of the circuit that supplies the clock is fed, a malfunction may be caused. On the other hand, when the frequency remains unchanged, the effect of spectrum spreading will be reduced, so that the effect of reducing the EMI may decrease.

FIG. 14 is a graph showing spectrum images in the states shown in FIGS. 11, 12, and 13. Assume that the frequency response characteristic is the same, but the target frequency of the clock differs. Then, the same phenomenon as in the case where the frequency response characteristic has been varied will occur.

When the frequency of the clock is increased, the phenomenon comparable to the case where the frequency response characteristic is slow will occur. When the frequency of the clock is reduced, the phenomenon comparable to the case where the frequency response characteristic is fast will occur.

Further, in the case of the configuration in FIG. 10, the second VCO 52 that inputs as a control voltage a value obtained by adding the analog modulated signal from the digital-to-analog converter 83 to the output voltage of the filter 38 generates the modulated clock. Thus, the period of the analog modulated signal and the amplitude of the analog modulated signal become factors for determining the period of the modulation and the degree of the modulation, respectively.

In the case of the configuration in FIG. 10, the characteristics of the VCO vary depending on the manufacturing variations and changes in the supply voltage and the temperature used, as described before. Examples showing the characteristics of the control voltage over the VCO and the output frequency of the VCO under specific two conditions are shown in FIG. 15.

When an arbitrary frequency is output from the VCO, the control voltage (output voltage from the filter 38) differs depending on the manufacturing variations and conditions used. Thus, in the case where the analog modulated signal is added to the output voltage from the filter 38 to generate a spread spectrum clock, even if the amplitude of the analog modulated signal is constant, the output voltage from the filter 38 is different. Thus, the degree of modulation does not become constant.

Further, when the target frequency is different as well, the same phenomenon will occur.

The invention disclosed in this application is generally configured as follows:

A spread spectrum clock generation circuit according to one aspect of the present invention includes at least:

a delay control type oscillator for variably controlling an oscillation period thereof at an equal interval, based on a control signal;

a maximum modulation value determination circuit for determining a maximum value of a modulated signal from a value obtained by conversion of a minimum oscillation period of the delay control type oscillator by a control period interval of the oscillation period and an oscillation frequency control value for the delay control type oscillator; and a modulation signal generation circuit for receiving the maximum modulation value from the maximum modulation value determination circuit and generating a modulation control signal within the maximum modulation value. The delay control type oscillator receives a value obtained on adding the oscillation frequency control value to the modulation control signal as the control signal, and outputs a frequency modulated clock signal.

In the present invention, the value obtained by conversion of the minimum oscillation period of the delay control type oscillator by the control period interval of the oscillation period is set to be constant even when a delay value of an element is changed due to manufacturing variations or a condition used, and the frequency modulated clock signal with a degree of modulation maintained to be constant is output from the delay control type oscillator.

A spread spectrum clock generation circuit according to another aspect of the present invention includes:

first and second delay control type oscillators each for adjusting an oscillation period thereof at a predetermined control period interval, according to a control signal;

a phase comparator for comparing a phase of a clock signal obtained by frequency dividing an output clock signal of the first delay control type oscillator with a phase of a clock signal obtained by frequency dividing a reference clock signal;

a control circuit for generating a frequency control signal based on a result of phase comparison by the phase comparator and supplying the frequency control signal to the first delay control type oscillator as the control signal;

a maximum modulation value determination circuit for determining a maximum modulation value from a predetermined value, the frequency control signal, and a given modulation degree setting signal; and a modulation signal generation circuit for receiving the maximum modulation value from the maximum modulation value determination circuit and generating a modulation control signal within the maximum modulation value.

The second delay control type oscillator receives a value obtained by adding the modulation control signal from the modulation signal generation circuit to the frequency control signal from the control circuit as the control signal and outputs a frequency modulated clock signal.

In the present invention, the predetermined value for the maximum modulation value determination circuit is set to a value obtained by converting the minimum oscillation period of the second delay control type oscillator by the control period interval of the oscillation period. Alternatively, the minimum value of the frequency control signal is set to a value obtained by converting the minimum oscillation period of the second delay control type oscillator by the control period interval of the oscillation period.

A method of generating a spread spectrum clock signal according to another aspect of the present invention includes the steps of:

determining the maximum value of a modulated signal from a value obtained by conversion of the minimum oscillation period of a delay control type oscillator by the control period interval of an oscillation period and the oscillation frequency control value of the delay control type oscillator, the delay control type oscillator variably controlling the oscillation period thereof at an equal interval based on a control signal;

generating a modulation control signal within the maximum modulation value; and supplying a value obtained by adding the oscillation frequency control value to the modulation control signal to the delay control type oscillator as the control signal, and outputting a frequency modulated clock signal from the delay control type oscillator.

In the present invention, the value obtained by conversion of the minimum oscillation period of said delay control type oscillator by the control period interval of the oscillation period is preferably set to be constant even when a delay value of an element is changed due to manufacturing variations or a condition used; and the frequency modulated clock signal with a degree of modulation maintained at a desired value is output from said delay control type oscillator.

In the present invention, by performing computation using the value obtained by converting the minimum oscillation period of the delay control type oscillator by the control interval of the oscillation period, the oscillation frequency control value, and a desired modulation degree, the maximum value of a modulated signal is determined. The delay control type oscillator adjusts an oscillation period thereof at an equal interval based on the control signal.

The change rate of the delay value of semiconductor devices is constant even if the delay value of an element has been changed according to a condition used. Thus, the value obtained by converting the minimum oscillation period of the delay control type oscillator by the control interval of the oscillation period is made constant.

The oscillation period of the delay control type oscillator and the oscillation frequency control value plus the value obtained by converting the minimum oscillation period by the control period interval of the oscillation period are represented by a linear function that crosses the point of origin (0, 0). Accordingly, by determining the maximum value of the modulated signal using the "converted value plus the control value", the modulation degree becomes constant.

A delay-type phase adjusting circuit according to other aspect of the present invention includes:

a first variable delay circuit for receiving a reference clock and adding a delay to the reference clock, for output;

a phase comparator for receiving an output of the first variable delay circuit and the reference clock and detecting a phase difference therebetween;

a control circuit for generating a control signal for variably controlling a delay value of the first variable delay circuit based on a result of phase comparison by the phase comparator;

a second variable delay circuit for receiving an input signal and adding a delay to the input signal, for output; and a computation circuit for receiving a predetermined value and the control signal and variably controlling a delay value of the second variable delay circuit.

A delay-type phase adjusting method according to yet another aspect of the present invention comprises the steps of:

detecting a phase difference between an output of a first variable delay circuit and a reference clock by a phase comparator, said first variable delay circuit inputting the reference clock and adding a delay to the reference clock, for output;

generating a control signal for variably controlling a delay value of said first variable delay circuit by a control circuit, said control circuit inputting a result of phase comparison by said phase comparator;

variably controlling a delay value of a second variable delay circuit by a computation circuit, said computation circuit inputting a predetermined value and the control signal; and inputting an input signal and adding the delay defined by said computation circuit to the input signal, for output, by said second variable delay circuit.

In the present invention, the predetermined value is set to a value obtained by converting the minimum delay value of the variable delay circuits by a delay control period interval.

In the present invention, the control signal outputting the minimum delay value of the variable delay circuit is set to have a value obtained by converting the minimum delay value of the variable delay circuits by a delay control period interval.

The meritorious effects of the present invention are summarized as follows.

According to the present invention, even if manufacturing variations occur or a supply voltage, a temperature used, or a frequency used is varied, a frequency-modulated clock with a desired modulation degree can be supplied.

According to the present invention, reduction in an EMI reduction effect can be prevented.

According to the present invention, the modulation degree is made to be a desired value (a constant value) irrespective of the manufacturing variations or an environment used. A malfunction of a circuit for supplying a clock can be thereby prevented.

The present invention can help EMI standards to be cleared.

According to the present invention, a component used for EMI measures can be reduced.

Still other effects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 4A and 4B include tables showing operation examples of control signals;

PREFERRED EMBODIMENTS OF THE INVENTION

Figure 1:
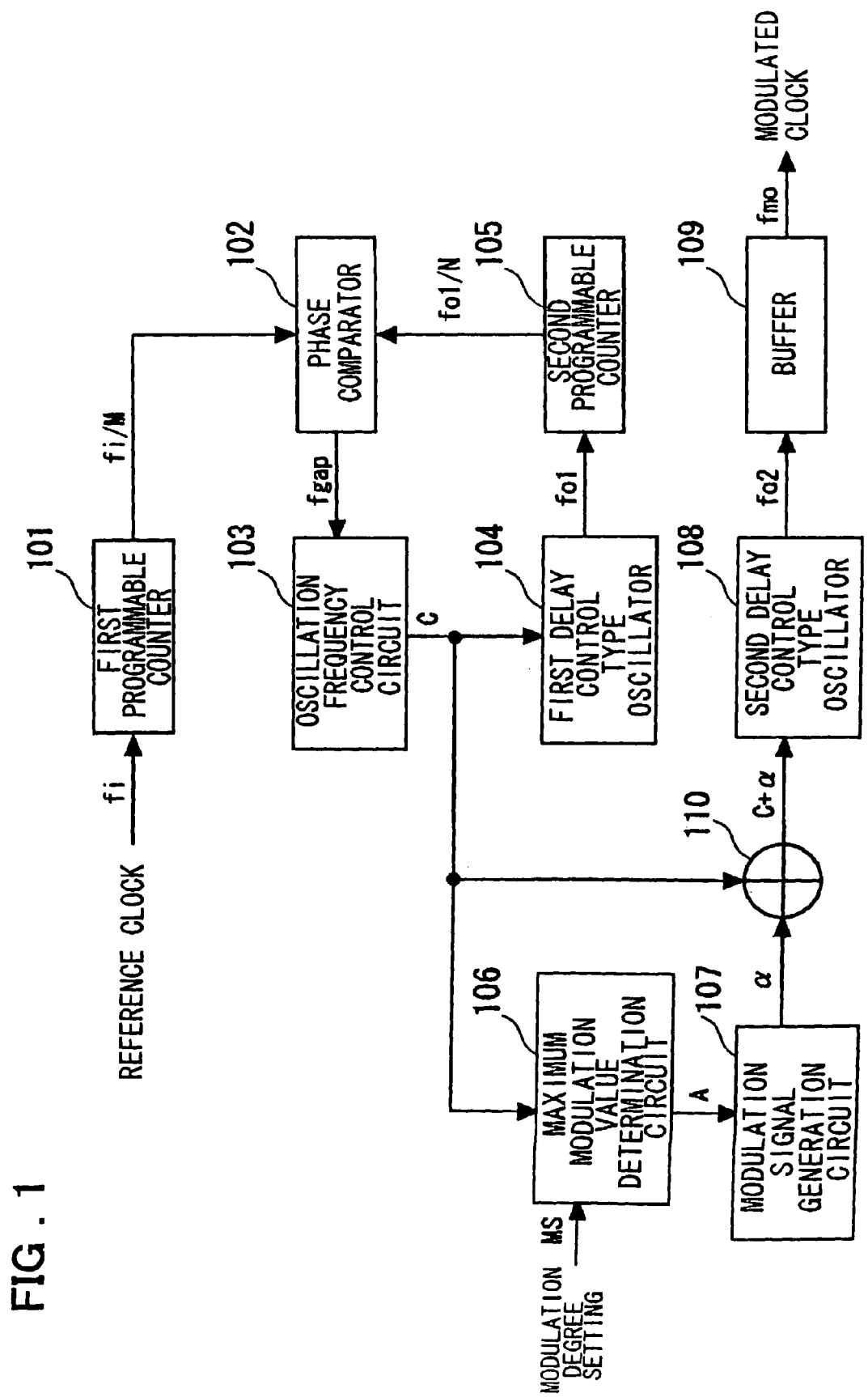
FIG. 1 is a diagram showing a configuration of a first embodiment of the present invention.

Preferred embodiments of the present invention will be described. The operational principle of an embodiment of the present invention will be outlined in the below. There are provided a first delay control type oscillator (104) that variably controls an oscillation period at a predetermined control period interval according to a control signal, a control circuit (103), a maximum modulation value determination circuit (106) that determines a maximum modulation value (A) from a predetermined value, a frequency control signal (C), and a given modulation degree setting signal (MS), a modulation signal generation circuit (107) that receives the maximum modulation value (A) from the maximum modulation value determination circuit (106) and generates a modulation control signal (α) within the maximum modulation value (A), and a second delay control type oscillator (108) that receives a value obtained by adding the modulation control signal (α) from the modulation signal generation circuit (107) to the frequency control signal (C) as a control signal and variably controls the oscillation period of an output clock signal at the predetermined control period interval according to the control signal. The control circuit (103) outputs the frequency control signal (C) for variably controlling the oscillation period based on the result of phase comparison performed by a phase comparator (102) between a clock signal (fo1) obtained by frequency dividing the output clock signal of the first delay control type oscillator and a clock signal (fi/M) obtained by frequency dividing a reference clock signal (fi).

The minimum oscillation period and the control period interval when the delay control type oscillators (104, 108) are designed are indicated by T1 and D1, respectively. Then, the predetermined value (B) is constituted from the value obtained by dividing the minimum oscillation period of the second delay control type oscillator by the control period interval. Then, the maximum modulation value determination circuit (106) outputs a value (B+C)×MS obtained by multiplying, the predetermined value (B) added to the frequency control signal (C) by the modulation degree setting signal (MS) as the maximum modulation value (indicated by "A"). The maximum period modulation of the output clock signal from the second delay control type oscillator (108) becomes (B+C)×MS×D0 (in which the D0 is the control period interval of an actual device). The frequency control signal (C) when the period of the output clock signal (fo1) of the first delay control type oscillator (104) becomes the period of the reference clock signal (fi) is given by T0+D0×C, in which the minimum oscillation period of the actual device is indicated by T0. Due to the relationship of the delay ratio of T0/D0=T1/D1, the modulation degree=(B+C)×MS×D0/(T0+D0×C) becomes the MS, which is a constant value without depending on manufacturing variations, a supply voltage, a temperature, and a frequency. A detailed description will be given below in conjunction with embodiments.

FIG. 1 is a diagram showing a configuration of an embodiment of the present invention. Referring to FIG. 1, a spread spectrum clock generation circuit according to the present embodiment includes a first programmable counter 101, the phase comparator 102, the oscillation frequency control circuit 103, the first delay control type oscillator 104, and a second programmable counter 105. The first programmable counter 101 receives the reference clock fi and outputs the clock fi/M obtained by frequency dividing the reference clock fi by M. The phase comparator 102 receives the output fi/M of the first programmable counter 101 at one input terminal thereof. The oscillation frequency control circuit 103 receives a frequency error signal fgap, which is a result of comparison by the phase comparator 102 and outputs the frequency control signal C. The first delay control type oscillator 104 receives the frequency control signal C from the oscillation frequency control circuit 103 and outputs the oscillation clock fo1. The second programmable counter 105 receives the output of the first delay control type oscillator 104 and outputs a clock fo1/N obtained by frequency dividing the output of the first delay control type oscillator 104 by N. The phase comparator 102 receives the output of the second programmable counter 105 at a second input terminal thereof and detects a phase difference between the output fi/M of the first programmable counter 101 and the output fo1/N of the second programmable counter 105. The spread spectrum clock generation circuit further includes the maximum modulation value determination circuit 106, the modulation signal generation circuit 107, an adder 110, the second delay control type oscillator 108, and a buffer 109. The maximum modulation value determination circuit 106 receives the modulation degree setting signal MS and the frequency control signal C from the oscillation frequency control circuit 103, for determination of a maximum modulation value. The modulation signal generation circuit 107 receives the maximum modulation value A output from the maximum modulation value determination circuit 106 and outputs the modulation signal α. The adder 110 adds the signal C from the oscillation frequency control circuit 103 to the modulation signal α from the modulated signal generation circuit 107. The second delay control type oscillator 108 receives an output C+α of the adder 110 and generates an oscillation clock fo2. The buffer 109 receives the output of the second delay-type oscillation circuit 108 and outputs a modulated clock fmo.

The phase comparator 102 and the oscillation frequency control circuit 103 have a PLL configuration that performs a feedback operation such that the clock signal fi/M frequency divided by M by the first programmable counter 101 has the same frequency as (is phase synchronized to) the clock signal fo1/N frequency dividing the clock signal fo1 output from the first delay control type oscillator 104 by N using the second programmable counter 105. Meanwhile, means for making the frequency of the oscillation clock fo1 constant is not limited to this configuration.

The first delay control type oscillator 104 adjusts the period of the oscillation clock at an equal interval (referred to as a "control period interval") according to the control signal C. The second delay control type oscillator 108 adjusts the period of the oscillation clock at the equal interval (referred to as the "control period interval") according to the control signal C+α.

In order to implement the degree of modulation specified from an outside by the modulation degree setting signal MS, the maximum modulation value determination circuit 106 determines the maximum value A from the value of the oscillation frequency control signal C and the value obtained by converting the minimum oscillation period of the second delay control type oscillator 108 by the oscillation control period interval.

The modulation signal generation circuit 107 generates the modulation control signal α of which the maximum value becomes the given A or less. As the modulation control signal α, the modulation signal generation circuit 107 outputs 0, 1, 2, ..., A−1, A, A−1, ..., 2, 1, 0, −1, −2, ..., −(A−1), −A, −(A−1), ..., −2, −1, 0, 1, 2, ..., for example, in this stated order. That is, as the modulation control signal α, the modulation signal generation circuit 107 outputs 0 to A in a ¼ modulation cycle, A to −A in a ¼ to ¾ modulation cycle, and −A to 0 in a ¾ to one modulation cycle.

In the present embodiment, the second delay control type oscillator 108 is controlled by the control signal C+α obtained by adding the modulation control signal α to the oscillation frequency control signal C, thereby obtaining the modulated clock signal fmo. When the α is zero, the frequency of the output clock of the first delay control type oscillator 104 becomes the same value as the frequency of the output clock of the second delay control type oscillator 108.

Period control is performed over the first delay control type oscillator 104 and the second delay control type oscillator 108 at an equal control period interval D0 from a minimum oscillation period T0. The first delay control type oscillator 104 and the second delay control type oscillator 108 are the oscillation circuits each of which adjusts the oscillation period thereof by adjusting a delay value in an oscillation loop based on the input control signal. When the delay value is increased, the oscillation period becomes longer. When the delay value is reduced, the oscillation period becomes shorter. An arbitrary known configuration can be employed as this delay control type oscillator. Though no particular limitation is imposed, adjustment of the number of delay elements, for example, can be performed as a configuration for adjusting the delay value of the oscillation loop. As an example, the delay control type oscillator has the configuration in which the number of inverters constituting the oscillation loop (in which the number of the inverters is an odd number) is adjusted and controlled based on the control signal in a ring oscillator where the output of the last stage of cascaded inverters constituted from the odd number of the inverters is feedback connected to the input of the first stage of the cascaded inverters. In this case, the control signal input to each delay control type oscillator is associated with the number of stages of the period intervals in FIGS. 4 and 5 that will be described later.

From the minimum oscillation period T1 and the control period interval D1 at the time of designing, B is determined as follows:

$$T1/D1 = B \quad (1)$$

The maximum value A of the modulation control signal is determined from the following equation (2) with the modulation degree setting indicated by the MS:

$$A = (B+C) \times MS \quad (2)$$

In order to obtain the period of the reference oscillation clock fo1, the frequency control signal C is determined at the oscillation frequency control circuit 103 so that the frequency control signal C becomes T0+D0×C, with respect to the minimum oscillation period T0, control period interval D0, and the frequency control signal C in an actual device:

$$T0 + D0 \times C \quad (3)$$

As described before, the maximum period modulation is given by the following equation (4) with the modulation degree setting indicated by the MS and the control period interval indicated by the D0:

$$(B+C) \times MS \times D0 \quad (4)$$

The degree of modulation is given by the following equation (5):

$$\text{Degree of Modulation} = \{(B+C) \times MS \times D0\}/(T0+D0 \times C) \quad (5)$$

where
the B is given by T1/D1 (where the T1 indicates the minimum oscillation period, and the D1 indicates the control period interval),
the MS indicates the modulation degree setting,
the T0 indicates the minimum oscillation period,
the D0 indicates the control period interval, and
the C indicates the frequency control signal.

The change rate of the delay of the semiconductor devices caused by the manufacturing variations and the use environment thereof is constant. For this reason, the ratio T1/D1 between the minimum oscillation period T1 and the control period interval D1 determined at the time of designing and the ratio T0/D0 at the time of a different condition are constant.

The degree of modulation is given by the following equations (7) when the following equation is substituted into the above equation (5):

$$B = T0/D0 \quad (6)$$

$$\text{Degree of Modulation} = \{(B+C) \times MS\}/(B+C) = MS \quad (7).$$

As described above, the degree of modulation becomes the fixed value MS (modulation degree set value) that is independent of the manufacturing variations, supply voltage, temperature used, and frequency. Accordingly, the modulation degree of the modulated clock signal is made constant.

Figure 2:
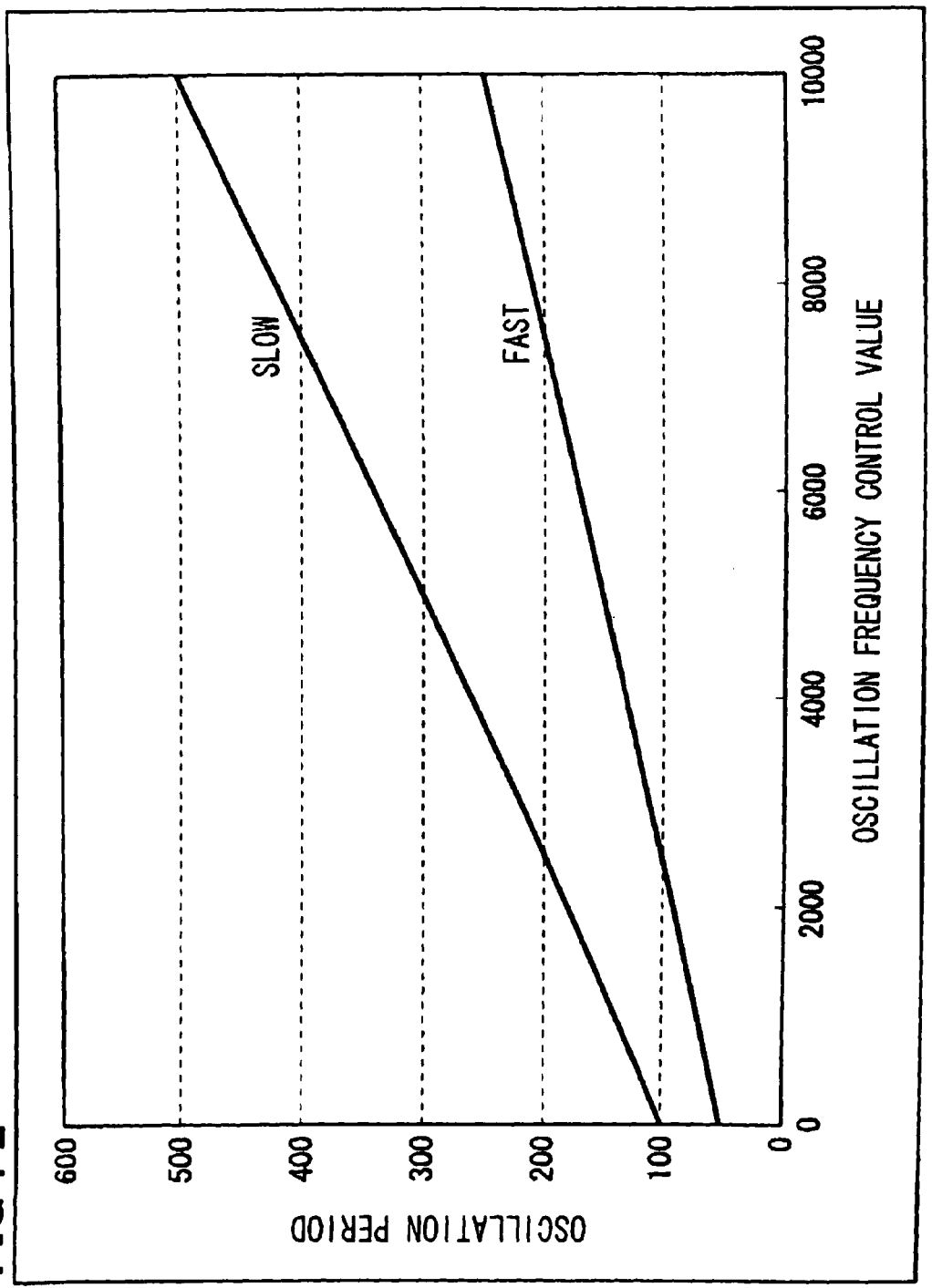
FIG. 2 is a graph showing relationships between an oscillation frequency control value and an oscillation period in delay control type oscillator.

The reason why the modulation degree becomes constant will be described, using other example. FIG. 2 shows relationships between the oscillation frequency control value and the oscillation period in the delay control type oscillators 104 and 108. Conversion of the minimum oscillation period by the control period interval is the same as giving an offset to the oscillation frequency control value. When the oscillation frequency control value (on a horizontal axis) is zero, the oscillation period (on a vertical axis) assumes a predetermined value.

Figure 3:
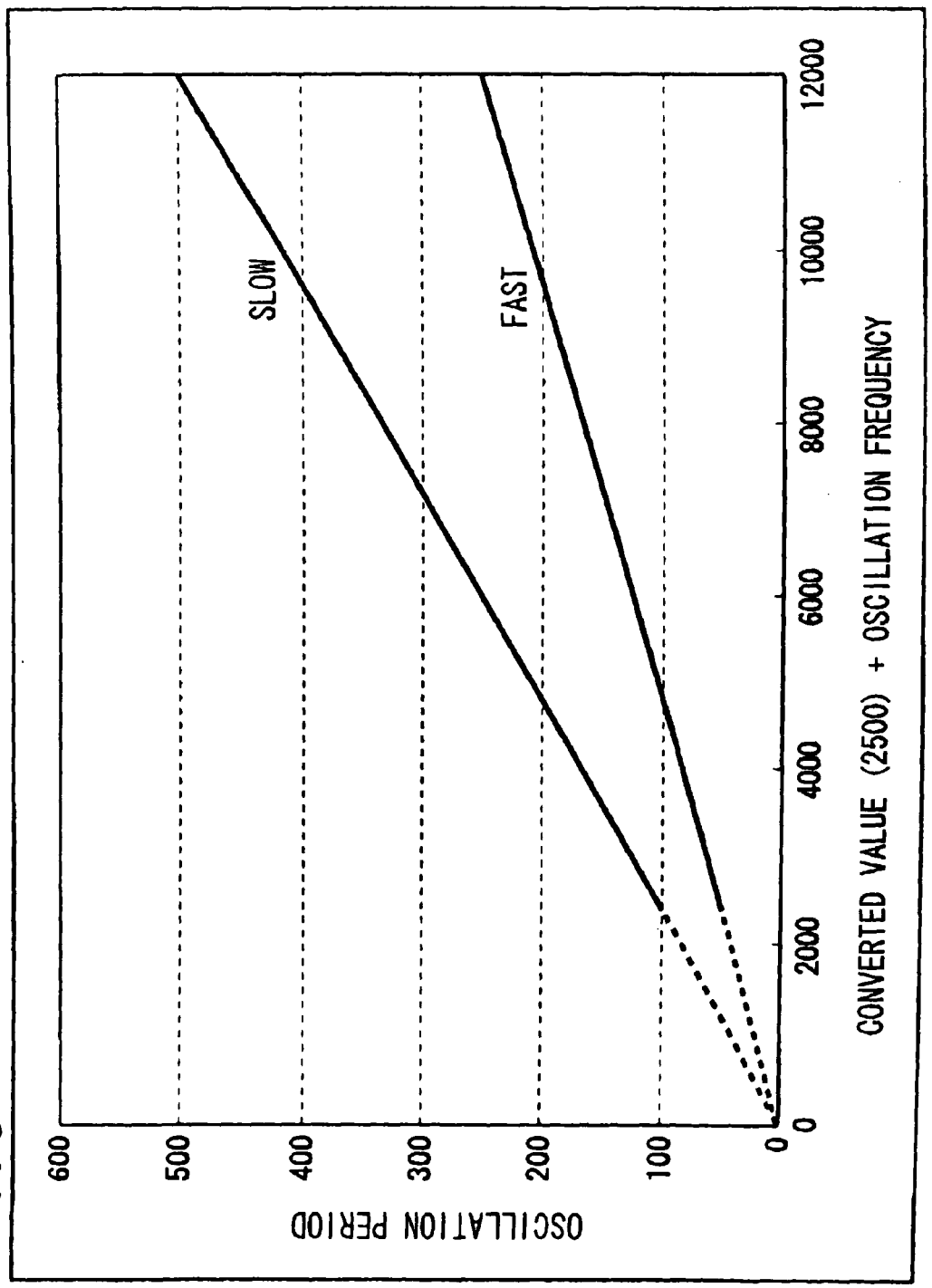
FIG. 3 is a graph showing relationships between a converted value plus the oscillation frequency control value and the oscillation period in the delay control type oscillator.

Then, the relationship between the oscillation period and the oscillation frequency control value in which the minimum oscillation period (T) is converted by the control period interval (D) becomes a linear function that crosses the point of origin (0, 0) irrespective of the conditions used, as shown in FIG. 3. Thus, the maximum value of the modulation control signal calculated by multiplying the modulation degree by:

$$[\text{Converted Value}] + [\text{Oscillation Frequency Control Value}] \quad (8)$$

has the same modulation degree with respect to the oscillation period as well.

FIGS. 4A and 4B show numerical examples. FIG. 4A shows a case indicated as follows:

$$[\text{Minimum Oscillation Period } T1]/[\text{Control Period Interval } D1] = 300 \text{(Fixed)} \quad (9),$$

and is an example where the modulation degree ±0.8% with a period of 5,000 ps (picoseconds) is obtained.

In a state A in FIG. 4A, the minimum oscillation period T0 is set to 3000 ps, and the control period interval D0 is set to 10 ps. The converted value of 300 is then calculated by the following equation: 3000 ps/10 ps=300. When the value of the frequency control signal C is 200, a synchronized state (in which the phase of fi/M is synchronized with the phase of fo1/N) is attained. Thus, the maximum value A of the modulation degree control signal becomes the value of four calculated by the following equation: (300+200)×0.8%=4. The modulation period thus becomes 40 ps using the equation of 4×10 ps=40 ps.

A state B in FIG. 4A shows a case where the delay value has become a half of that in the state A due to the influence of the manufacturing variations and environmental fluctuations. The minimum oscillation period T0 is set to 1500 ps, the control period interval D0 is set to 5 ps, and the converted value is set to 300, using the equation of 1500 ps/5 ps=300. In the state B, when the value of the frequency control signal C is 700, the synchronization state is attained. Then, the maximum value A of the modulation degree control signal becomes eight using the following equation: (300+700)×0.8%=8. The modulation period thus becomes 40 ps obtained using the equation of 8×5 ps=40 ps. The modulation degree in this case becomes ±0.8%, which is the same as the set value.

FIGS. 4A and 4B list the minimum oscillation period and the control period interval. The maximum value of the modulation control signal, however, can be determined from the predetermined T1/D1 of 300 and the value of the frequency control signal C.

A state C in FIG. 4B shows a case where with the conditions of the state A, a target period has become 7000 ps. In this case, too, the set degree of modulation can be obtained. In the state C, when the value of the frequency control signal C is 450, the synchronization state is attained, and the maximum value A of the modulation degree control signal becomes six using the equation of (300+450)×0.8%=6. The modulation period becomes 60 ps using the equation of 6×10 ps=60 ps. The modulation degree in this case becomes ±60 ps/7500 ps, which becomes the ±0.8% that is the same as the set value.

Figure 5:
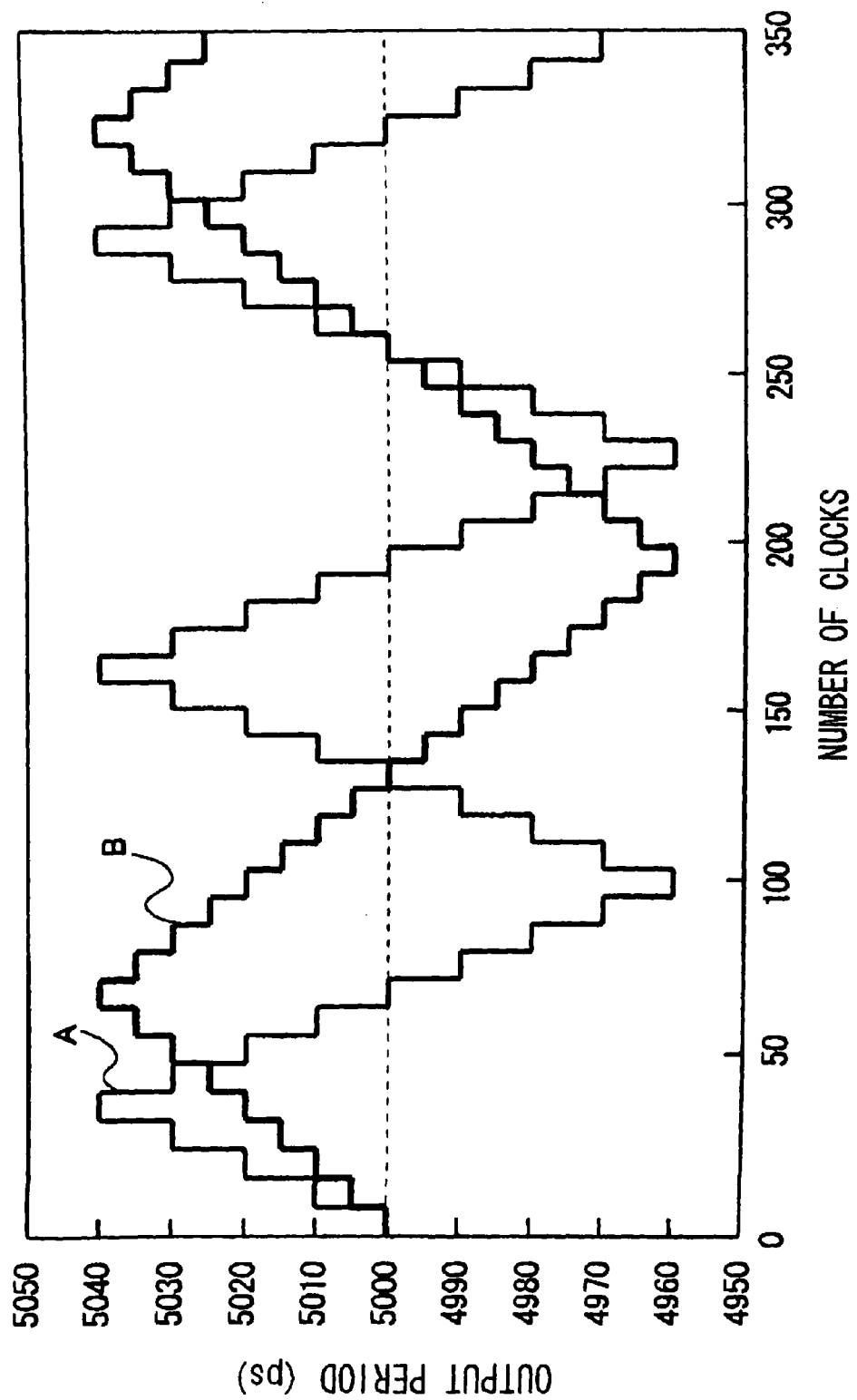
FIG. 5 is a graph showing modulation images of states A and B in FIG. 4.

FIG. 5 is a graph showing period transition of the states A and B in FIG. 4. Since the modulation is a digital period modulation, the modulation becomes a step-wise period modulation. Incidentally, the control signal (C+α) input to the second delay control type oscillator 108 in FIG. 1 defines the number of steps of the period intervals of the oscillation clock.

Figure 6:
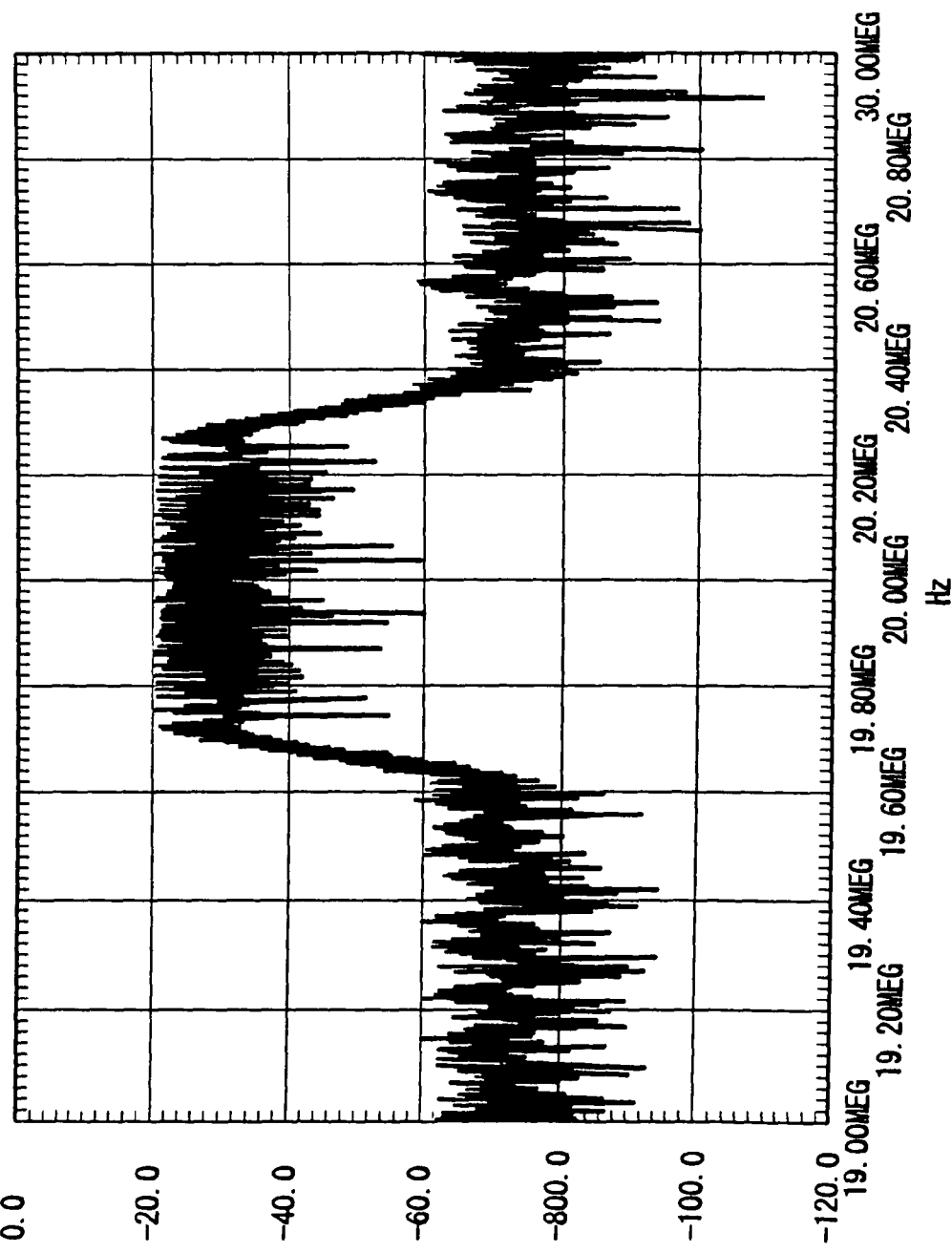
FIG. 6 is a graph showing a spectrum of a step-type modulated clock.

FIG. 6 is a graph showing a frequency spectrum obtained by applying an FFT (Fast Fourier Transform) to the step-wise period modulation in FIG. 5. As shown in FIG. 6, it can be seen that even in the step-wise frequency modulation, there is the effect of reducing a peak spectrum.

A second embodiment of the present invention will be described. In the first embodiment described before, the maximum modulation value determination circuit 106 is configured to hold the value B obtained by converting the minimum oscillation period of the second delay control type oscillator 108 by the oscillation control period (oscillation frequency control value). In the second embodiment, a minimum oscillation control signal value for the second delay control type oscillator 108 is the value B obtained by converting the minimum oscillation period of the second delay control type oscillator 108 by the oscillation control interval. In other words, the frequency control signal with the minimum value B is included.

The maximum modulation value determination circuit 106 in the first embodiment has a computation circuit for the (B+C)×MS. In the second embodiment, the maximum modulation value determination circuit 106 becomes the computation circuit for C×MS. For this reason, the adder circuit for the (B+C) becomes unnecessary, thus reducing the size of the circuit.

In the first embodiment described before, the operation of the modulation signal generation circuit 107 is generation of a signal of a center-spread type. In the second embodiment, by repeating transition of the modulation control signal α in only a positive direction, such as 0, 1, ..., A−1, A, A−1, ... 1, 0, 1 ..., and the like, modulation of a down-spread type to a low frequency can be implemented.

As a third embodiment of the present invention, by repeating transition of the modulation control signal α only in a negative direction, such as 0, −1, ..., −(A−1), −A, −(A−1), ..., −1, 0, −1 ..., and the like, modulation of a up-spread type to a high frequency can be implemented.

Further, the transition of the modulation control signal α should be just in the range of the maximum value A. The pattern of the transition is not limited to those described above. Accommodation to various systems thereby becomes readily possible.

Figure 7:
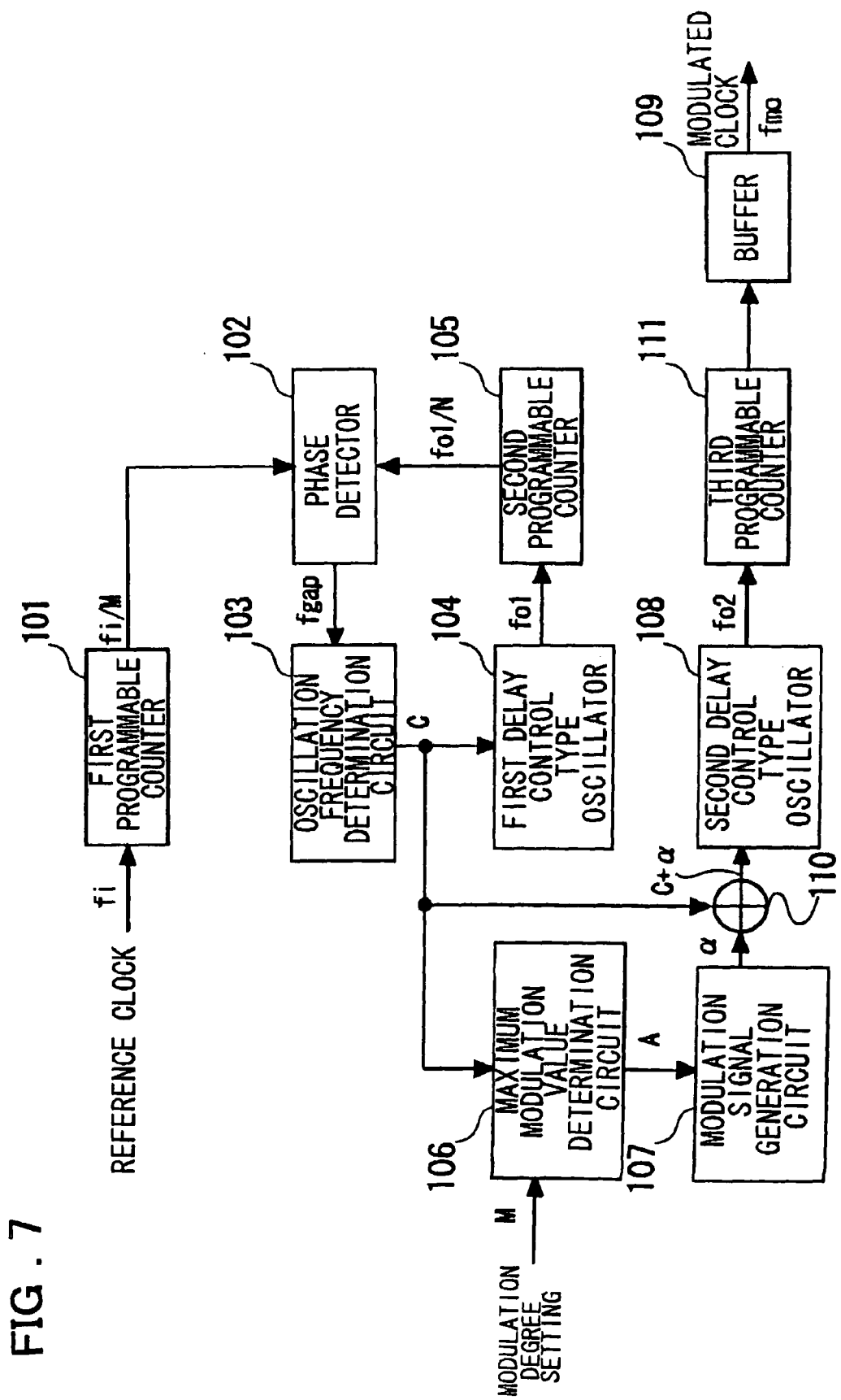
FIG. 7 is a diagram showing a configuration of a fourth embodiment of the present invention.

FIG. 7 is a diagram showing a configuration of a fourth embodiment of the present invention. Referring to FIG. 7, a third program counter 111 is provided in a stage subsequent to the second delay control type oscillator 108 in the first embodiment in FIG. 1. The third programmable counter 111 frequency divides the output of the second delay control type oscillator 108 by L. In the frequency division by L, the period which provides a basis for the frequency division becomes L times. However, the period at the time of the modulation also becomes L times, so that the modulation degree remains unchanged.

In the fourth embodiment of the present invention, the frequency band of an output modulated clock can be expanded without expanding the frequency bands of the delay control type oscillators. Thus, an increase in the area is small because a low frequency band is handled.

Figure 8:
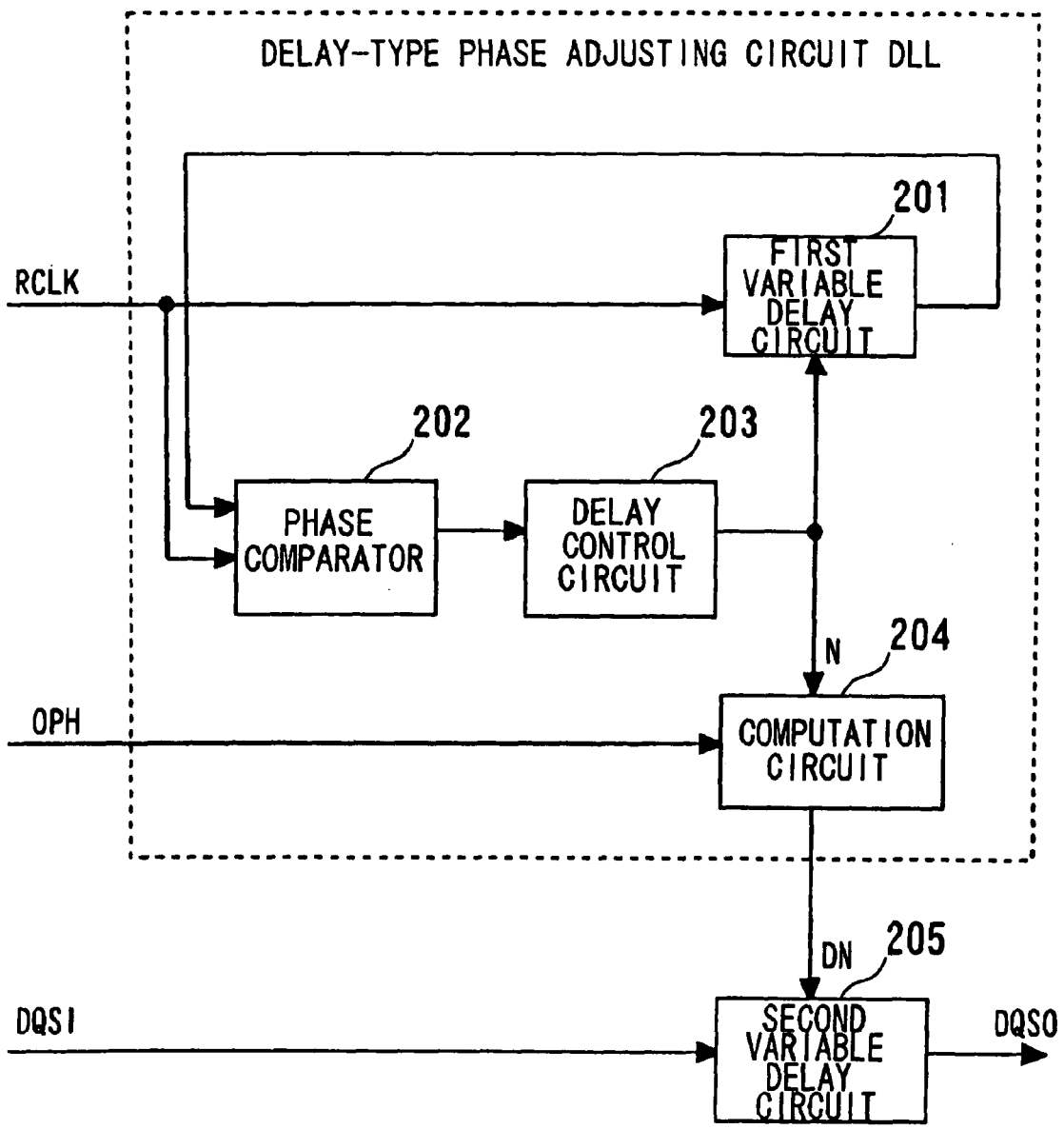
FIG. 8 is a diagram showing a configuration of a fifth embodiment of the present invention.
Figure 9:
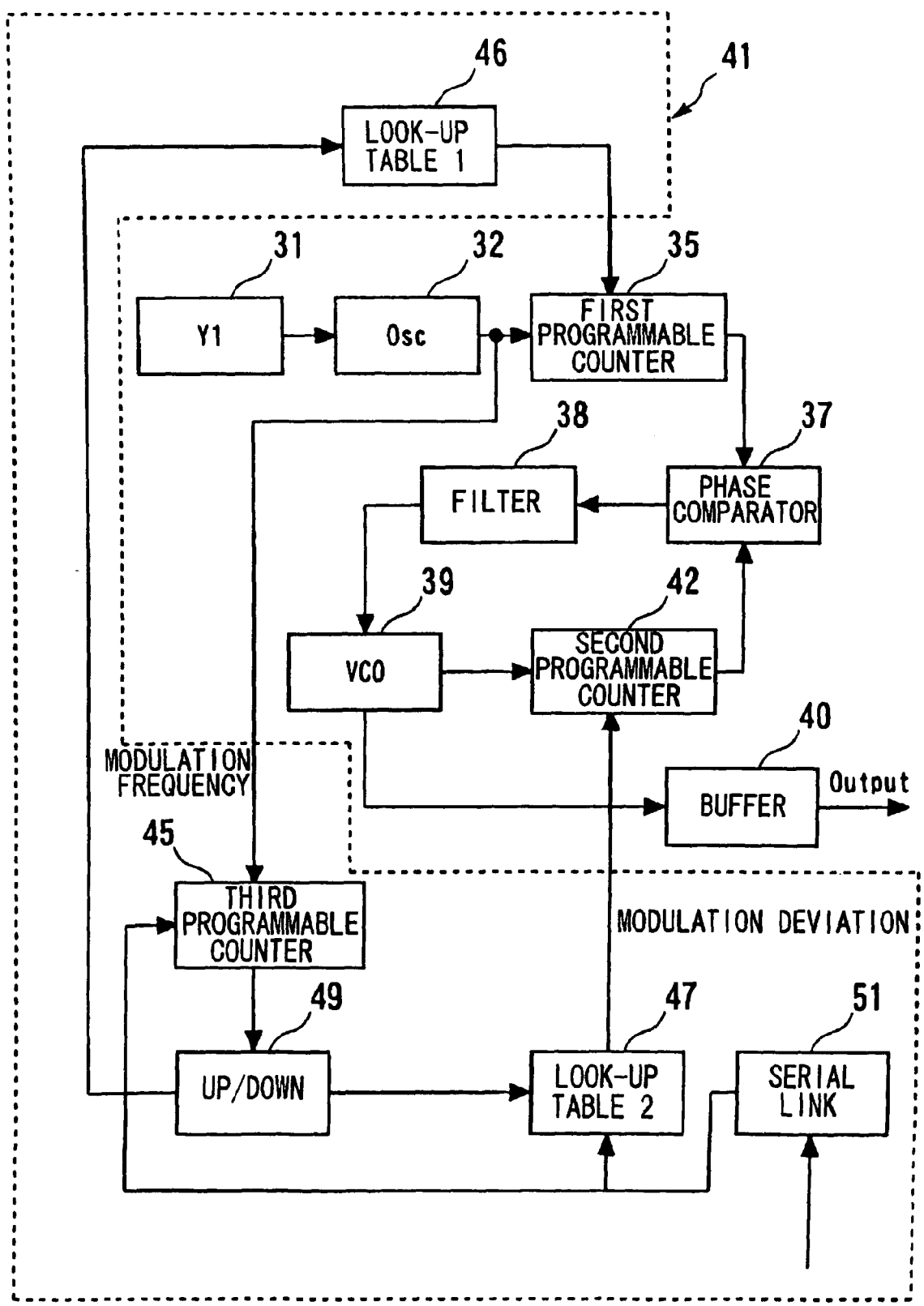
FIG. 9 is a diagram showing an example of a configuration of conventional SSCG.
Figure 10:
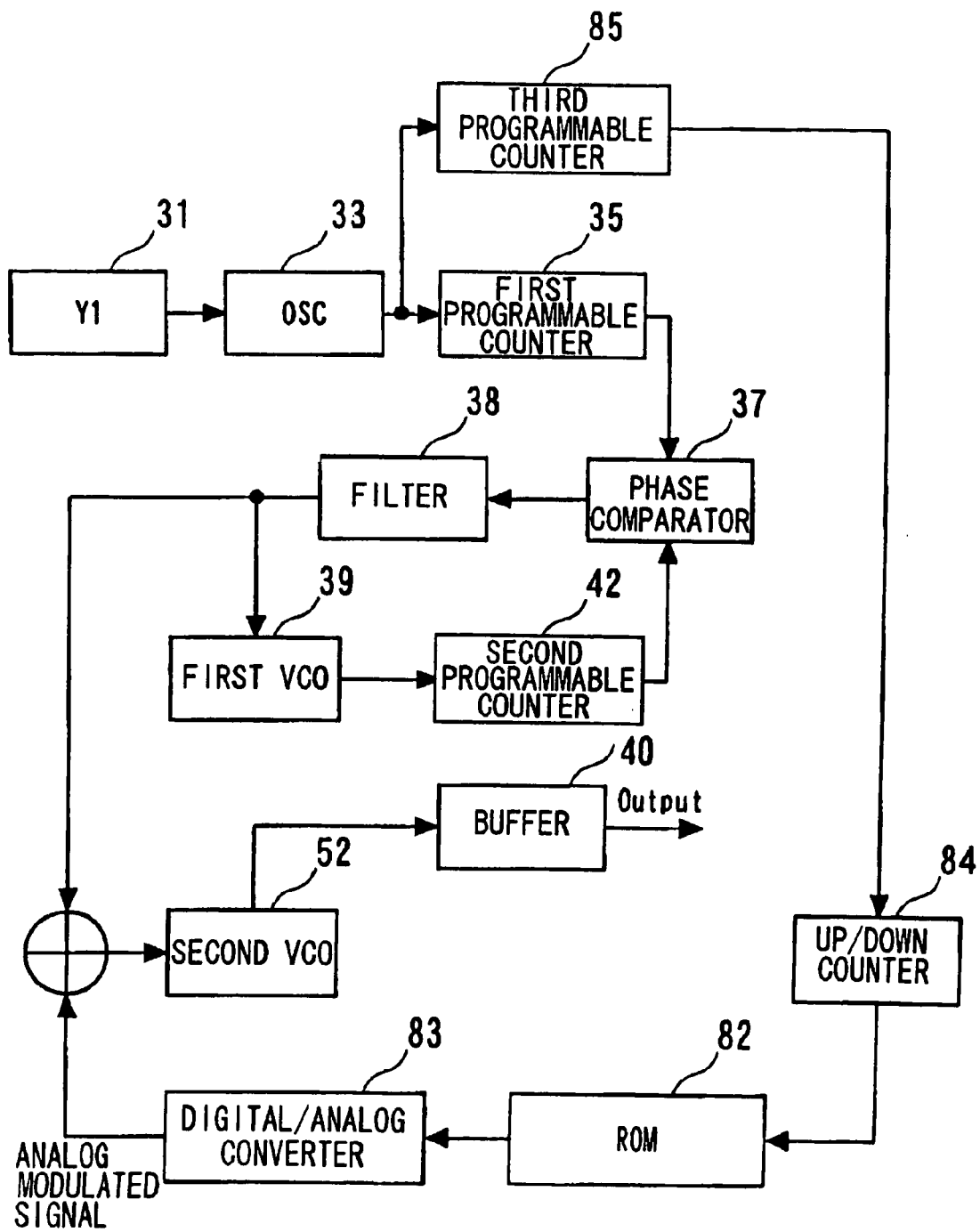
FIG. 10 is a diagram showing an example of a configuration of the conventional SSCG.
Figure 11:
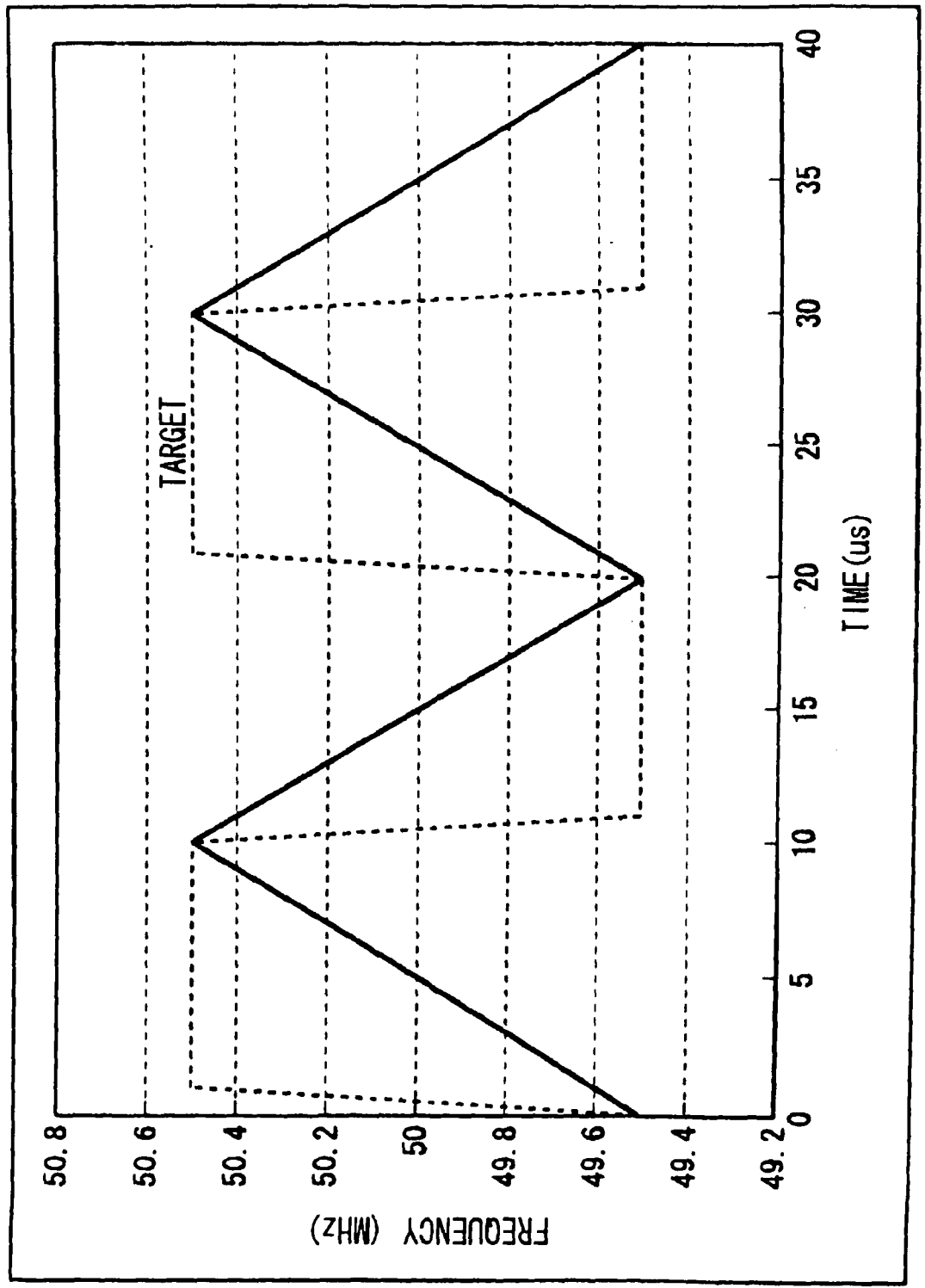
FIG. 11 is a graph showing a frequency transition when a frequency response is optimum.
Figure 12:
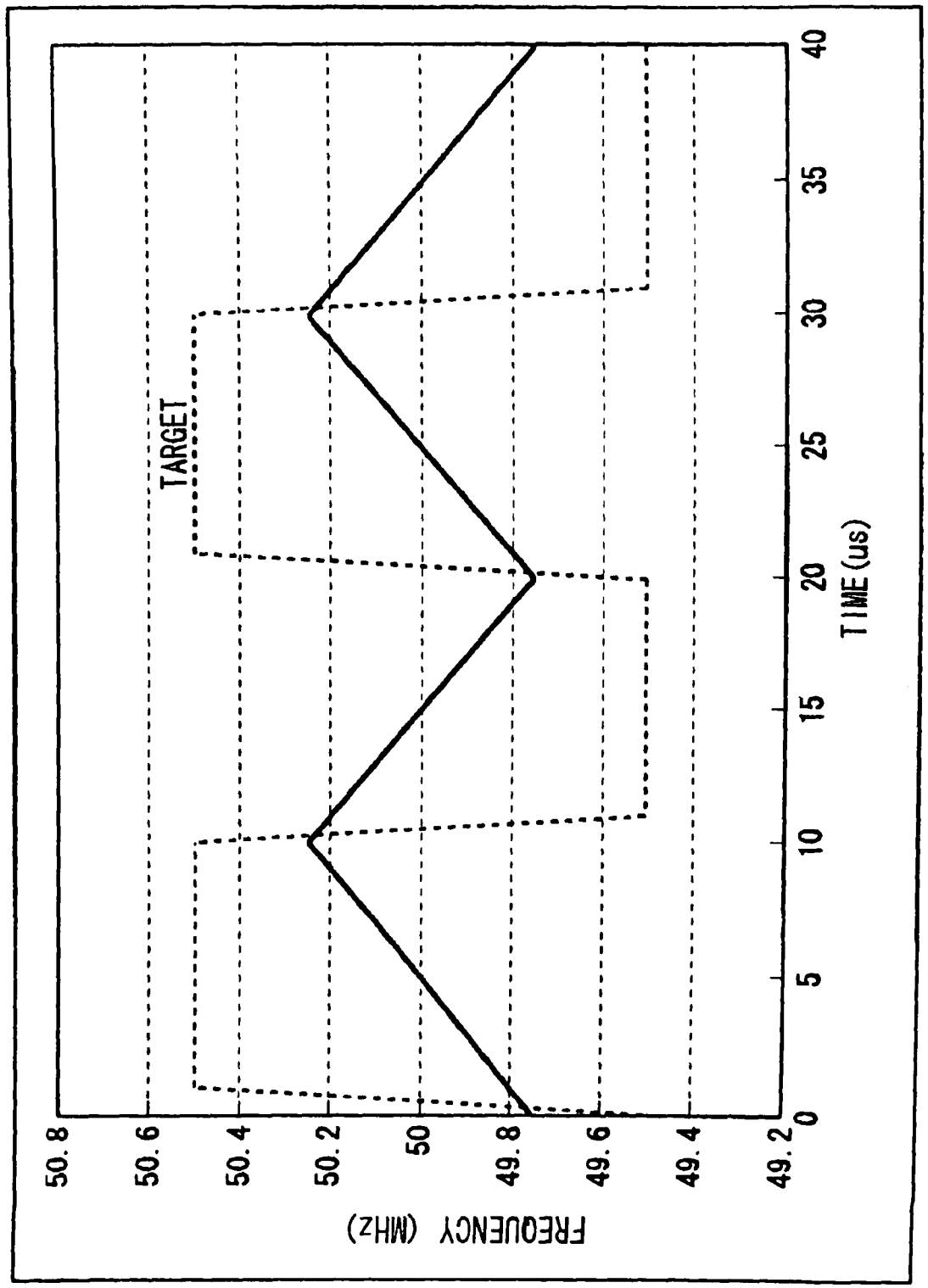
FIG. 12 is a graph showing a frequency transition when the frequency response is slow.
Figure 13:
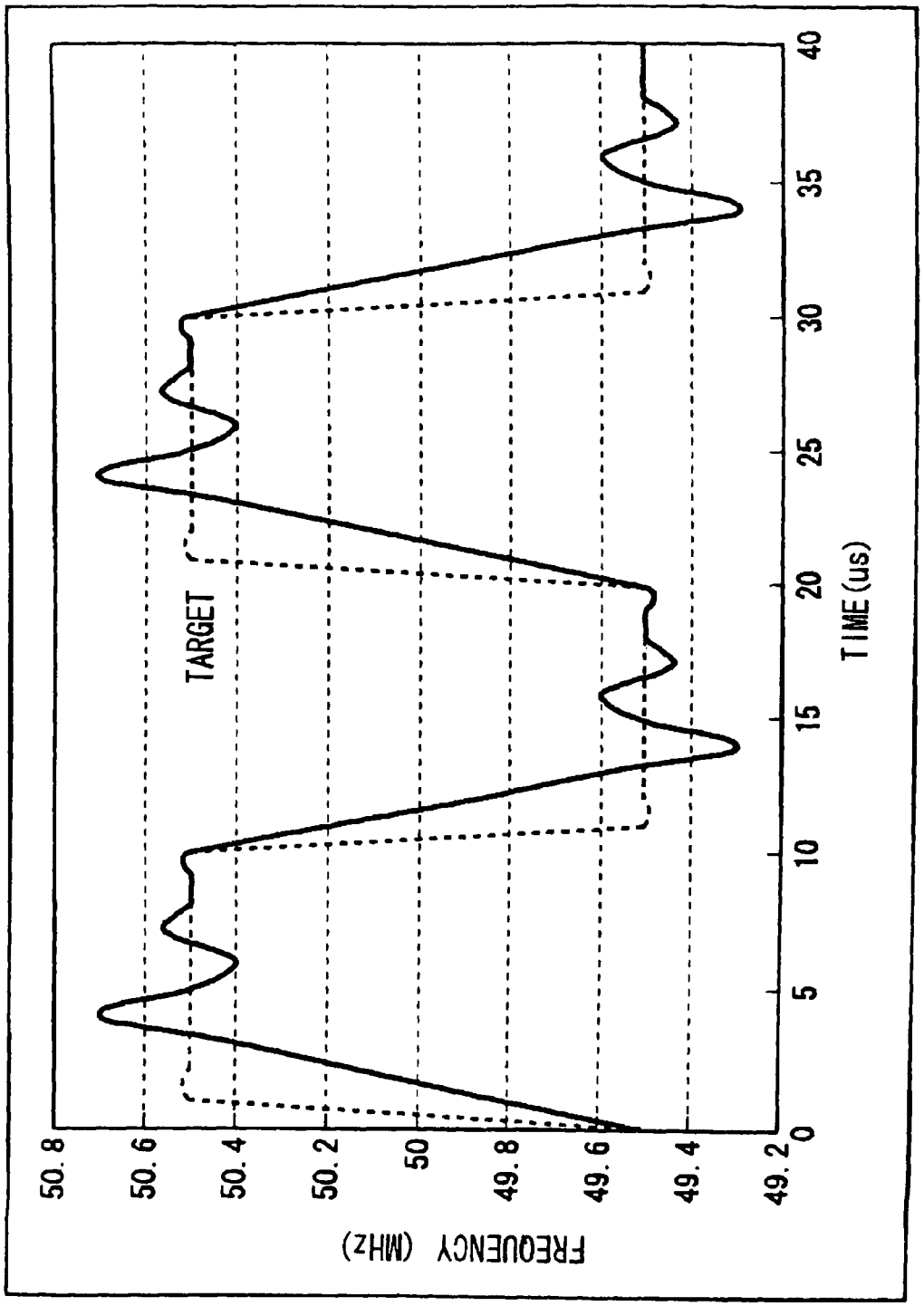
FIG. 13 is a graph showing a frequency transition when the frequency response is fast.
Figure 14:
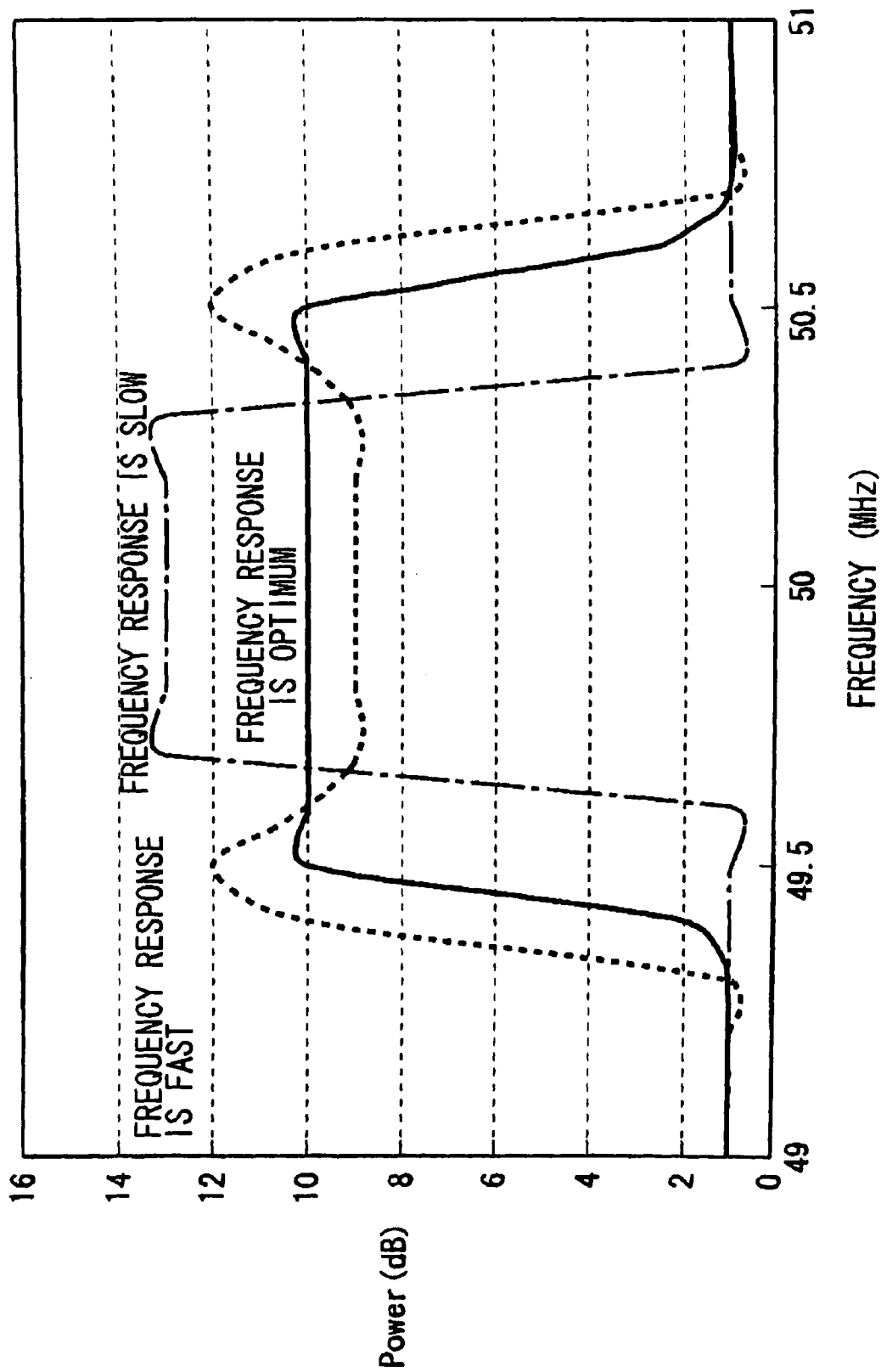
FIG. 14 is a graph showing spectrums of states in FIGS. 11, 12, and 13.
Figure 15:
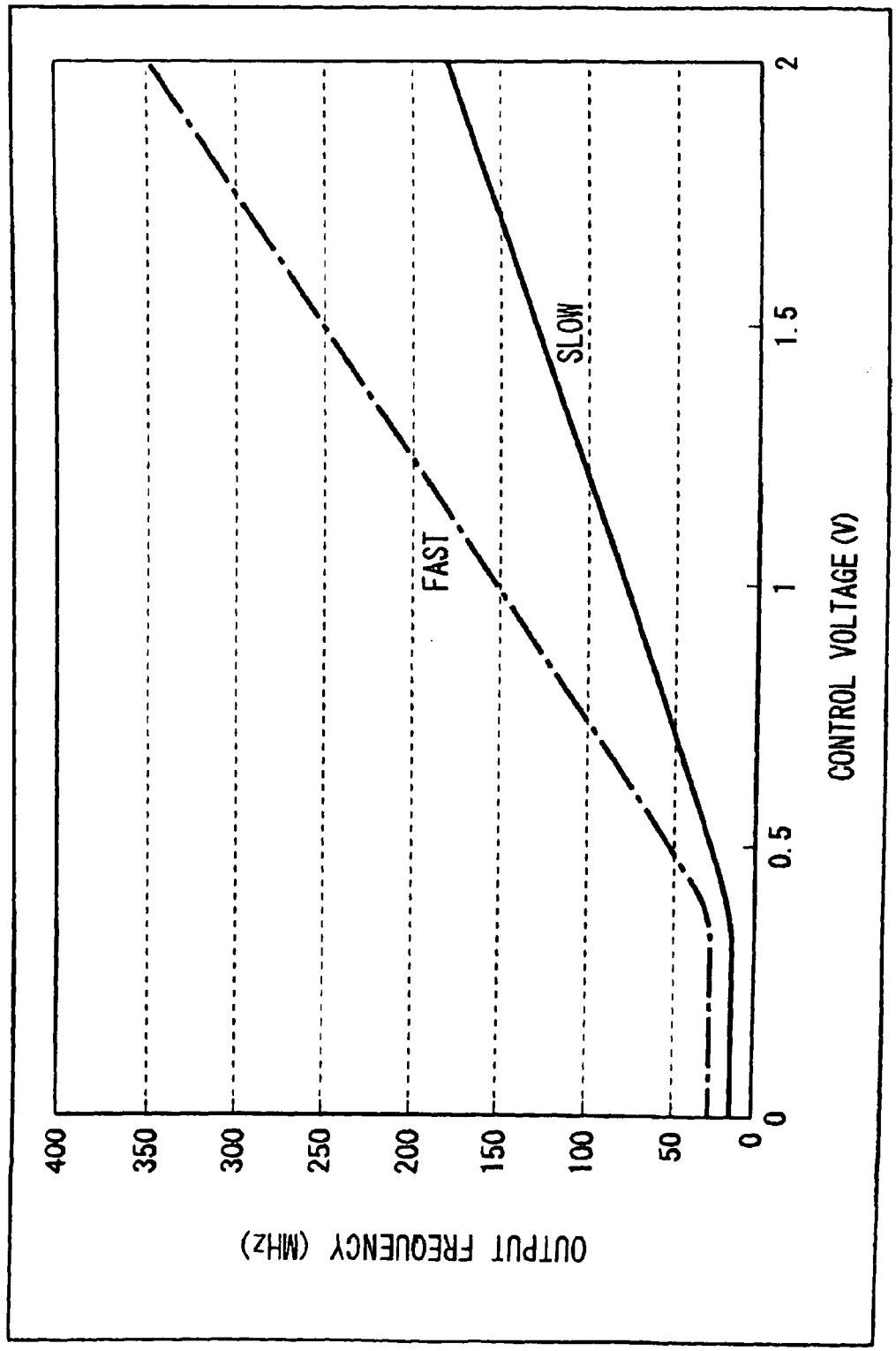
FIG. 15 is a graph showing a control voltage and output frequency characteristic of a VCO.

Next, other embodiment of the present invention will be described. FIG. 8 is a diagram showing a configuration of a fifth embodiment of the present invention. The fifth embodiment of the present invention shows a case where the invention has been applied to a delay-type phase adjustment circuit (DLL: Delay Locked Loop).

In the delay-type phase adjustment circuit, a phase comparator 202 and a delay control circuit 203 perform an adjustment operation so that the delay value of a first variable delay circuit 201 becomes the length of one period of a received clock signal RCLK.

A second variable delay circuit 205 has the same characteristics as the first variable delay circuit 201. In order to output a desired phase set by a phase control signal OPH, a delay value is added to an input signal DQSI by a phase control signal DN. An arbitrary delay value can be thereby obtained.

The delay value of the second variable delay circuit 205 becomes the value delayed by one period of the RCLK when:

$$DN=N \quad (10).$$

Through a computation using the ratio $B(=T0/D0)$ between the minimum set delay value T0 of a delay A of the variable delay circuit and the delay control interval D0 under a certain condition, the value of a delay control signal N, and the phase setting signal OPH, the phase output setting signal DN can be obtained.

When a phase of 90 degrees is necessary for the phase setting signal OPH, or when the OPH=90/360=1/4 in a case where the delay of a quarter of the period is necessary, computation should be performed by using the following equation:

$$DN=(B+N) \times OPH - B \quad (11)$$

The delay value necessary to obtain the delay of one period of the RCLK is given by:

$$T0+D0 \times N \quad (12)$$

Assume that the control signal as follows is input to the second variable delay circuit 205:

$$DN=(B+N) \times 1/4 - B \quad (13)$$

Then, the delay value of the second variable delay circuit 205 becomes:

$$T0+D0 \times ((B+N) \times 1/4 - B) \quad (14).$$

Assume that the following equation is substituted into the above formula (14):

$$B=T0/D0 \quad (15).$$

Then, the delay value of the second variable delay circuit 205 becomes as follows:

$$1/4 \times (T0+D0 \times N) \quad (16)$$

A delay of a quarter of one period of the RCLK can be thereby obtained.

As shown in the first embodiment, the change rate of a delay caused by the manufacturing variations, supply voltage, and temperature used is constant. Thus, the B should be determined under a certain condition in advance.

When design is performed with the minimum delay control signal of the delay adjustment circuit set as the B as in the fifth embodiment, computation can be performed using the following equation:

$$DN = N \times OPH \tag{17}$$

The variable delay circuit according to the present embodiment cannot be set to the minimum delay value or less, but there is no problem in designing the variable delay circuit that can supply an output delayed by a phase of 90 degrees used in the case of a DDR (Double Data Rate) SDRAM device.

The foregoing description was given in conjunction with the embodiments described above. The present invention, however, is not limited to only the configurations of the embodiments described above, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A delay-type phase adjustment circuit, comprising:
    a first variable delay circuit for receiving a reference clock signal and adding a first delay to the reference clock signal, for output;
    a phase comparator for receiving an output of said first variable delay circuit and the reference clock signal and detecting a phase difference therebetween;
    a control circuit for generating a control signal for variably controlling a first delay value of said first variable delay circuit based on a result of phase comparison by said phase comparator;
    a second variable delay circuit for receiving an input signal and adding a second delay to the input signal, for output; and
    a computation circuit for receiving a predetermined value and the control signal and variably controlling a second delay value of said second variable delay circuit,
    wherein the predetermined value is set to a value obtained by converting a minimum delay value of the first and second variable delay circuits by a delay control interval.

2. The delay-type phase adjustment circuit according to claim 1, wherein the control signal being a minimum delay value output of the variable delay circuits is set to have a value obtained by converting a minimum delay value of the variable delay circuits by a delay control interval.

3. The delay-type phase adjustment circuit according to claim 1, wherein, based on the result of the phase comparison by said phase comparator, said control circuit performs a control so that the first delay of the output of said first variable delay circuit from the reference clock signal becomes one period of the reference clock signal.

4. A semiconductor integrated circuit device comprising the delay-type phase adjustment circuit according to claim 1.

5. The delay-type phase adjustment circuit according to claim 1, wherein the second variable delay circuit is substantially same as the first variable delay circuit.

6. The delay-type phase adjustment circuit according to claim 1, wherein the computation circuit generates a phase output setting signal at the second variable delay circuit based on the predetermined value, the control signal, and a phase setting signal.

7. The delay-type phase adjustment circuit according to claim 1, wherein the computation circuit a setting value DN of a phase output setting signal at the second variable delay circuit as $DN = (B+N) \times OPH - B$,
    wherein B, N and OPH represent the predetermined value, set value of the control signal.

8. The delay-type phase adjustment circuit according to claim 1, wherein the second delay value of the second variable delay circuit is represented by a formula: $\frac{1}{4} \times (T0 + D0 \times N)$,
    wherein T0 is a minimum delay value, D0 is a delay control interval and N represents the control signal.

* * * * *